United States Patent [19]

Browne et al.

[11] Patent Number: 4,766,387
[45] Date of Patent: Aug. 23, 1988

[54] MOTOR WINDING INSULATION RESISTANCE MONITORING SYSTEM

[75] Inventors: Frederick D. Browne, Atlanta, Ga.; Fred E. Sevier, Stoneham, Mass.

[73] Assignee: The Charles Stark Draper Laboratory, Inc., Cambridge, Mass.

[21] Appl. No.: 24,813

[22] Filed: Mar. 12, 1987

[51] Int. Cl.⁴ .......................................... G01R 31/06
[52] U.S. Cl. ............................. 324/545; 324/158 MG; 324/525; 324/551; 318/490; 340/647; 340/648
[58] Field of Search ............... 324/545, 158 MG, 510, 324/525, 551, 557, 546, 547; 318/490; 340/647, 648

[56] References Cited

U.S. PATENT DOCUMENTS 2,525,413 10/1950 Johnson ........................... 324/546
2,759,145 8/1956 Manley ...................... 324/158 MG

FOREIGN PATENT DOCUMENTS 48105 5/1981 U.S.S.R. ............................ 324/510

Primary Examiner—Reinhard J. Eisenzopf
Assistant Examiner—Maura K. Regan
Attorney, Agent, or Firm—Joseph S. Iandiorio; Douglas E. Denninger

[57] ABSTRACT

A motor winding insulation resistance monitoring system for measuring the insulation resistance of a winding of a polyphase motor while the motor is operating including a motor winding insulation resistance measuring circuit. A switching mechanism is provided for selectively interconnecting each winding with a separate phase power source and the winding insulation resistance measuring circuit. The switching mechanism is directed to disconnect a winding from its power source and connect one end of that winding with the motor winding insulation measuring circuit to measure the resistance of that winding's insulation to ground while the motor continues operating.

17 Claims, 3 Drawing Sheets

MOTOR WINDING INSULATION RESISTANCE MONITORING SYSTEM

FIELD OF INVENTION

This invention relates to a motor winding insulation resistance monitoring system which measures the insulation resistance of a selected motor winding of a polyphase motor while the motor is operating.

BACKGROUND OF INVENTION

A major cause of failure in polyphase electric motors is the breakdown of the insulation which protects the motor windings. Such degradation can ruin an expensive motor. Moreover, in refrigeration systems which employ hermetically sealed motors, insulation failure can cause arcing which burns the plastic insulation and contaminates the refrigerant piping. This may necessitate expensive and time-consuming repairs to the system.

Traditionally, motors have been protected from sudden failure by devices such as circuit breakers and temperature switches which respond to excessive current or temperature by shutting down the motor before it fails. However, neither of these devices provides any indication of the cause of the problem or any warning of impending motor shutdown.

A number of devices employ an AC signal to monitor insulation faults. However, these systems typically require complex electronics and coupling devices. Certain other systems utilize a simpler DC detection circuit. However, such systems typically can be used only when the motor is not operating. And in a number of circumstances shutting down a motor can be very undesirable or even wholly unacceptable, such as when it is being employed in a large refrigeration system, such as in a frozen food warehouse, a hospital's water system, a cooling system for a missile or nuclear reactor, or in similar applications where continuous motor operation is essential. Another technique, utilized in refrigerant compressors, involves periodically testing the crankcase oil for acidity which can attack the insulation. Again, this technique requires that the compressor be shut down and also requires extensive operator intervention to open and close valves, take oil samples and check for leaks.

One device does employ DC detection to monitor insulation faults while the motor remains operational. However, it operates only with an ungrounded electrical power source and inasmuch as most power sources are grounded, this device has limited application. It also shuts down the motor which as indicated above may be very undesirable.

SUMMARY OF INVENTION

It is therefore an object of this invention to provide a system which effectively monitors the winding insulation resistance of a polyphase motor while the motor remains in operation.

It is a further object of this invention to provide such a monitoring system which detects and indicates potential problems in the motor before they occur so that appropriate corrective action may be taken.

It is a further object of this invention to provide a motor winding insulation resistance monitoring system which protects both a polyphase motor or compressor and the system in which the motor is utilized.

It is a further object of this invention to provide such a monitoring system which is particularly effective in protecting refrigeration and cooling systems from contamination such as is caused by electrical arcing which occurs when the winding insulation breaks down.

It is a further object of this invention to provide a motor winding insulation resistance monitoring system which operates effectively with a grounded power source.

It is a further object of this invention to provide a motor winding insulation resistance monitoring system which employs a simple but effective DC test signal.

It is a further object of this invention to provide a motor winding insulation resistance monitoring system which is uncomplicated and relatively inexpensive and which operates with minimal operator intervention or even automatically.

This invention results from the realization that the motor winding insulation resistance of a polyphase motor may be effectively and simply monitored while the motor remains operating by selectively disconnecting each winding from its respective phased power source and reconnecting that winding with an insulation measuring circuit which applies a test voltage to the winding so that the leakage resistance can be measured while the remaining windings continue to operate the motor.

This invention features a motor winding insulation resistance monitoring system for measuring the insulation resistance of a winding of a polyphase motor while the motor is operating. The system includes a winding insulation resistance measuring circuit and switching means for selectively interconnecting each winding with a separate phased power source and the insulation resistance measuring circuit. There are means for directing the switching means to disconnect a winding from its power source and connect one end of that winding with the motor winding insulation measuring circuit to measure the resistance of that winding's insulation to ground while the motor continues operating.

In a preferred embodiment, the motor winding insulation measuring circuit includes means for applying a test voltage to the winding which is disconnected from its power source. The means for applying may include means for applying a DC test voltage to the disconnected winding. The measuring circuit may be connected to an AC signal source and the means for applying may include means for filtering the AC signal from the circuit. The means for applying may include a voltage doubler attached to an AC signal source for converting the AC signal to DC, doubling the signal and providing the doubled DC signal to the disconnected winding. The measurement circuit may include means for limiting current through the voltage doubler. The measurement circuit may also include means, responsive to the applied test signal, for developing a signal which is indicative of the disconnected winding's insulation resistance. The means for developing may include means for filtering AC signals provided to the measuring circuit by the windings which remain connected. The measuring circuit may also include means responsive to the developed signal for determining the winding insulation resistance.

The switching means may include a double pole, double throw switch associated with each winding. The switching means may include relay means connected to a source of power and the means for directing may include means for selectively energizing the relay means to interconnect an associated winding with one of its phased power source and the insulation measuring circuit and de-energizing the relay means to interconnect the winding with the other of its phased power source and the winding insulation measuring circuit. The means for selectively energizing and de-energizing may include a manually operable switch, timer means and/or microprocessor means. Preferably there are means for interconnecting only one motor winding at a time with the measuring circuit. Means responsive to the measuring circuit may be provided for indicating the measured insulation resistance.

DISCLOSURE OF PREFERRED EMBODIMENTS

Other objects, features and advantages will occur from the following description of a preferred embodiment and the accompanying drawings, in which.

Figure 1:
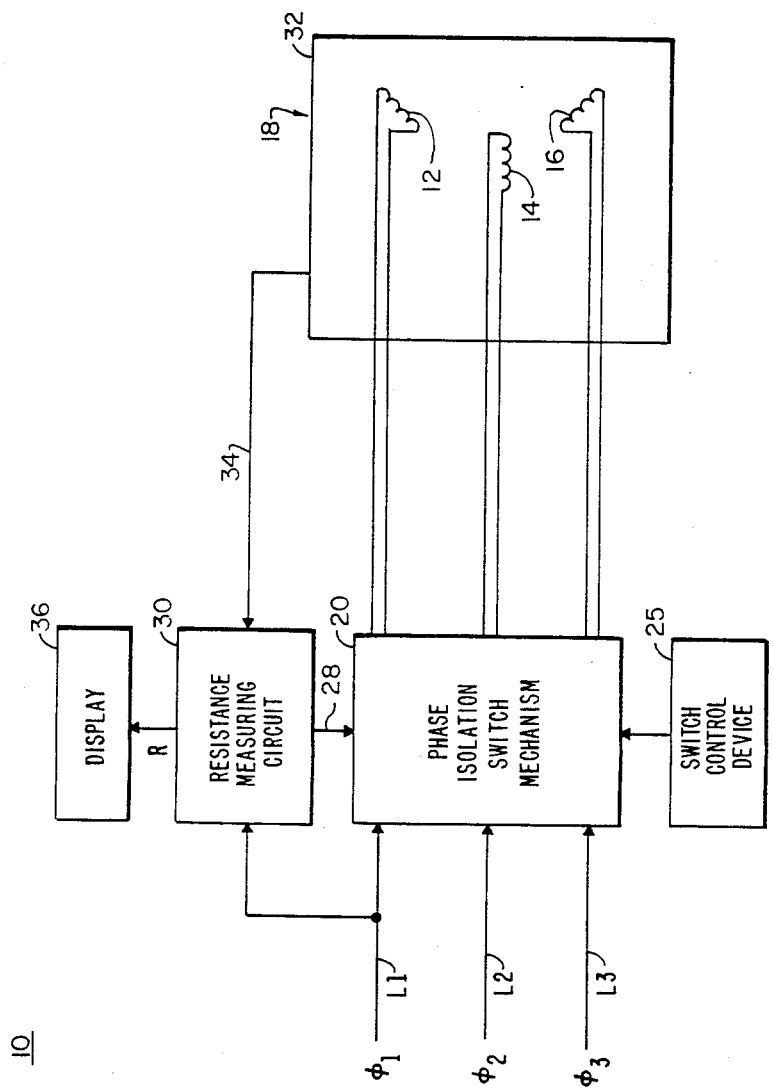
FIG. 1 is a block diagram of a motor winding insulation resistance monitoring system for a polyphase motor according to this invention.

The motor winding insulation resistance monitoring system of this invention measures the insulation resistance of a winding of a polyphase motor while the motor remains operating. For most induction motors, the windings are mounted on the stator. However, in alternative embodiments the windings may be provided on the rotor of the polyphase motor. The system includes a winding insulation measuring circuit and switching means such as a double pole double throw switch for selectively interconnecting each winding with a different phased power source and the insulation resistance measuring circuit. Alternatively, solid-state winding isolation switches or various other switching means may be employed. These switches are restricted to interconnecting only one winding at a time with the measuring circuit. Typically, the switches include a number of relay mechanisms which are connected to a source of power and selectively energized to interconnect respective windings with either the phased power source or the insulation measuring circuit. When a relay is de-energized, the winding is connected with the other of the phased power source and the insulation measuring circuit. These relays may be energized and de-energized in a number of ways. For example, each may be operated by a manually operable pushbutton switch. A slide mechanism or other device may be provided so that only one switch at a time may be pushed. Alternatively, a rotary switch may be utilized. A timer may be employed to energize and de-energize the relay means at predetermined intervals and such control may also be provided by a microprocessor, for example, the Hewlett-Packard 3488A switch control unit.

The measuring circuit preferably operates by applying a DC test voltage to the armature winding of interest. For example, line AC voltage is provided to a voltage doubler which converts the AC signal to DC, doubles the signal and provides that doubled signal to the disconnected winding. A preferred voltage doubler (multiplier) is Part No. 5VMS10, manufactured by Murata Erie. A resistor or similar means may be provided for limiting the current through the voltage doubler in the event of a short circuit.

Due to the test voltage, a leakage current, the level of which is dependent upon the degree of degradation of the winding's insulation, flows from the winding to the frame of the motor. This leakage current is directed back through the measuring circuit which develops a signal indicative of the disconnected winding's insulation resistance. The signal is typically developed across a resistor. This signal may then be processed to determine the insulation resistance of the winding. A digital or analog display may be provided to indicate the detected resistance or alternatively the leakage current or resistance signal. A strip chart recorder, printer or other recording device may be utilized to provide a record of these measurements. Various types of alarms may also be employed to warn of an undesirably low or undesirably high resistance. And corrective action electronics may be utilized to disconnect the load or power or perform other required action when defective conditions are sensed.

The normal operating resistance of a winding's insulation is typically between 100 megaohms and 100,000 megaohms and this system can measure deviations from that range. The invention is particularly effective for detecting insulation resistance which has dropped below 20 megaohms, the level at which problems with the insulation typically commence. The system can also be used to indicate when an undesirably large insulation resistance is present, for example, due to excessive drying and moisture loss from the insulation.

In a typical three-phase motor, a selected one of the windings is monitored in the above manner while the remaining two windings continue to operate the motor. The measurement interval for such an embodiment is preferably only as long as required for the reading to stabilize, e.g., approximately one-half minute. This interval is brief enough that the motor may be operated by the two remaining windings. During normal operation of a critical system, it may be desirable to measure the insulation resistance of one of the windings every 20 minutes. Therefore, each of the windings is tested every hour so that degradation of the insulation and potential problems may be spotted and corrected before major damage is done to the motor or the system it operates.

There is shown in FIG. 1 a motor winding insulation resistance monitoring system 10 for measuring the insulation resistance of windings 12, 14 and 16 of polyphase induction motor 18. To drive motor 18 phase isolation switch mechanism 20 connects three phase line power over lines L1, L2 and L3 to respective windings 12, 14 and 16. In order to measure the insulation resistance of, for example, winding 12, switch control device 25 operates switch mechanism 20 to selectively disconnect winding 12 from phased power line L1 and reconnect it with a test voltage signal 28 from resistance measuring circuit 30. Circuit 30 is itself powered by voltage line L1. The test voltage applied across winding 12 causes current to leak from winding 12 through the defective insulation to frame 32 of motor 18. This leakage current is returned over line 34 to resistance measuring circuit 30 which derives a signal from the current. This signal is then used to determine the insulation resistance and a signal R which is representative of that resistance is transmitted to and indicated by display 36.

Figure 2:
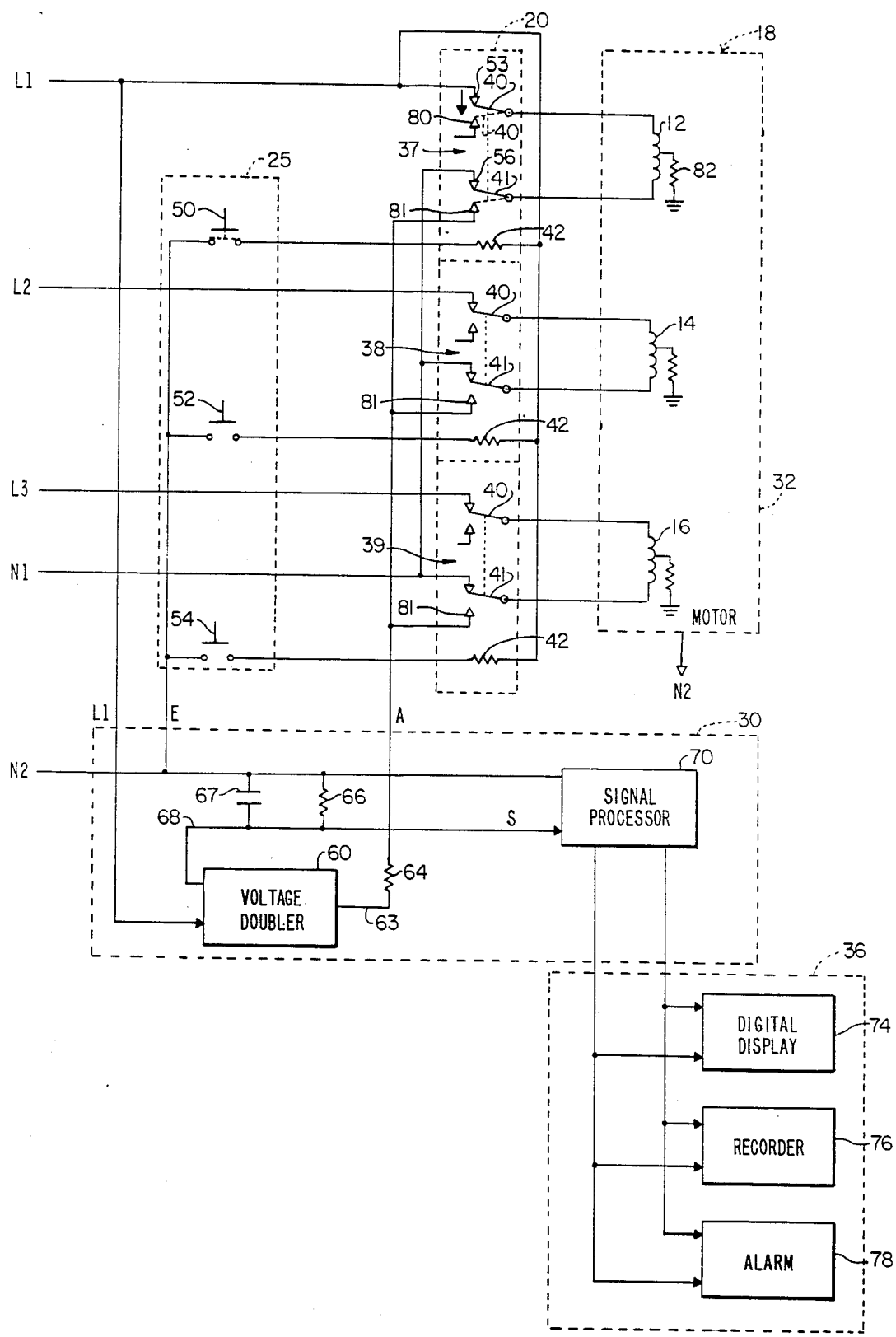
FIG. 2 is a schematic view of a preferred circuit for implementing the monitoring system.

As shown in FIG. 2, switch mechanism 20 includes three double pole, double throw switches 37, 38 and 39 which are associated with windings 12, 14 and 16 respectively. Each switch includes a pair of switchable contacts 40 and 41 and a relay coil 42. In order to provide operating power to winding 12, contact 40 of switch 37 engages fixed contact 53 of phased power line L1 and contact 41 engages contact 56 of neutral line N1. This completes a circuit from the phased power line through winding 12 and to the neutral line. Windings 14 and 16 are similarly provided with power from lines L2 and L3 through switches 38 and 39.

Each relay coil 42 is connected respectively at one end to power line L1. The opposite end of each relay coil is selectively connected to neutral line N1 through a respective pushbutton switch 50, 52 and 54 within switch control device 25. While switches 50, 52 and 54 are open their respective relay coils 42 remain de-energized. As a result, the contacts 40 and 41 of each switch 37, 38 and 39 remain engaged with fixed contacts 53 and 56, respectively. By closing a selected one of switches 50, 52 and 54, an associated relay coil 42 is energized by power from line L1 to operate one of the switches 37, 38 or 39 of mechanism 20 so that it disconnects its associate winding from phased power line L1, L2 or L3 and reconnects it with measuring circuit 30. The details of this operation are described more fully below.

Resistance measuring circuit 30, FIG. 2, includes a voltage doubler 63 which is connected to power from phased power line L1. An output line 62 extends from the positive terminal of voltage doubler 60 across limiting resistor 64 and terminates at contacts 81 within respective switches 37, 38 and 39 of switch mechanism 20. A neutral line N2 connected to frame 32 of motor 18 returns to circuit 30. A 6200 ohm resistor 66 and a bypass capacitor 67 are connected across line N2 and line 68 which returns to the negative terminal of voltage doubler 60. Likewise, a signal processor 70 is connected across lines N2 and 68. The output of the signal processor drives various devices of display 36. Such display devices may include, for example, a digital display 74, a strip chart recorder 76, and an alarm 78 which may signal when either the resistance is too low or too high.

In order to measure the insulation resistance of a particular winding, that winding is disconnected from its phased power source and reconnected with measuring circuit 30. For example, to monitor winding 12, pushbutton switch 50 of switch control device 25 is depressed as shown in phantom. This completes a circuit across relay coil 42 of switch 37 so that the coil is energized. As a result, as shown in phantom, contact 40 of switch 37 is disengaged from contact 53 and switched into engagement with dummy contact 80. Similarly, contact 41 of switch 37 is disengaged from contact 56 and switched into engagement with terminal 81. Line power is no longer provided from line L1 to winding 12. Instead, winding 12 is connected with measurement circuit 30.

Voltage doubler 60 converts the AC signal it receives from line L1 to DC and doubles the voltage received from the power line to provide an output of approximately 250 volts over line 63. Limiting resistor 64 protects the voltage doubler from damage in case of a short circuit. This voltage is applied through terminal 81 and contact 41 to winding 12. As a result, current leaks through the winding's insulation, as indicated by resistance 82, to ground, e.g., to frame 32 of motor 18. The degree of leakage is dependent upon the condition of the insulation and hence the resistance provided by the insulation. If the insulation is in good condition, leakage should be relatively small. However, worn or degraded insulation will result in an increased leakage current to the motor frame.

The leakage current is conducted by line N2 back to measurement circuit 30. Therein, resistor 66 develops a signal S which is representative of the resistance of the winding's insulation. Typically, this signal may include an undesirable AC component resulting from capacitive coupling between the winding being measured and the two remaining windings which continue to employ an AC signal to drive the motor. This AC component constitutes noise which can interfere with the resistance measurement. Accordingly, capacitor 67 is provided to reduce the effects of capacitive coupling by filtering the AC component from signal S. Filtered signal S is then provided to a signal processor 70 which calculates the insulation resistance according to the following formula:

$$R = V_A/I_L$$

where R is the insulation resistance, $V_A$ is the applied test voltage and $I_L$ is the leakage current.

The leakage current $I_L$ is itself determined according to the formula:

$$I_L = S/R_1$$

where $R_1$ is the resistance value of resistor 66 and S is the measured signal. Combining these equations yields:

$$R = (V_A \times R_1)/S.$$

Employing the specified preferred values for $V_A$ (250 volts), $R_1$ (6200 ohms) and the determined value of signal S, the equation is solved as follows:

$$R = (250\ V \times 6200\Omega)/S$$

A signal representative of the detected measured insulation resistance is thus provided, for example, to digital display 74, recorder 76 and alarm 78.

Figure 3:
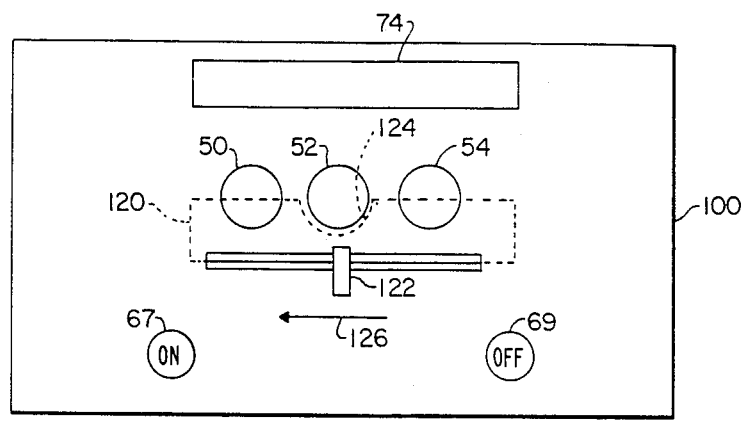
FIG. 3 is an front elevational view of a push button device for selecting the winding to be monitored by the monitoring system.

Pushbutton switches 50, 52 and 54, FIG. 3, are located on the front face of a housing 100 which contains system 10. In order to measure the insulation resistance of a selected winding, the measuring circuit, located within housing 100, is turned on by actuating switch 67 and an individual winding is then monitored by depressing a selected one of the pushbutton switches 50, 52 and 54. To ensure that only one switch 50, 52 and 54 is closed and, as a result, only one winding is disconnected at any one time, slide 120 is disposed between the rearward end of the respective pushbutton switches 50, 52 and 54 and neutral line N2. Slide 120 is attached by an elongated element, not shown, to an adjusting lever 122 located outside of housing 100. Lever 122 is generally aligned with a notch 124 in slide 120. The notch permits a selected pushbutton to pass therethrough and engage the neutral line when that pushbutton switch is depressed. In FIG. 3, notch 124 is positioned to receive pushbutton switch 52 so that winding 14, FIG. 2, can be monitored by the resistance measuring circuit. And the measured insulation resistance is indicated on digital display 74. At the same time, slide 120 prevents buttons 50 and 54 from being depressed. Windings 12 and 16 therefore remain energized to operate the motor.

In order to engage pushbutton switch 50 and thereby monitor its associated winding 12, lever 122 is moved in the direction of arrow 126 until notch 124 is positioned to receive pushbutton switch 50. This provides switch 50 with access to the neutral wire so that its associated winding 12 can be monitored by the resistance measuring circuit. At the same time, slide 120 prevents depression of pushbuttons switches 52 and 54. To monitor winding 16, switch 54 is actuated in a manner identical to switches 50 and 52. When measurements are no longer required the measuring circuit is turned off by actuating "off" button 69.

Preferably, each of the pushbutton switches 50, 52 and 54 must be depressed against a heavy spring which urges the pushbutton into a raised condition so that its associated relay coil is de-energized. This discourages the operator from disconnecting one of the windings for an undesirably long period of time.

Figure 4:
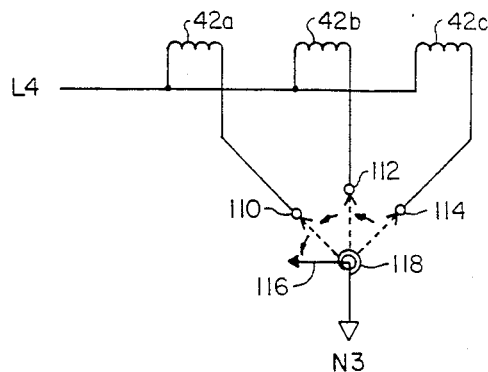
FIG. 4 is a schematic view of an alternative rotary switch for selecting the winding to be monitored.

An alternative mechanism for energizing and de-energizing relay coils 42a, 42b and 42c (each associated with one of the windings of the motor) is shown in FIG. 4. Each of the coils is connected at one end to a phased power line L4. The opposite end of each coil includes a respective terminal 110, 112 and 114. A rotary switch 116 is connected to a neutral line N3 and is biased by a spiral spring 118 so that it does not engage terminals 110, 112 and 114. As a result, during normal operation coils 42a, 42b and 42c remain de-energized and their associated windings remain energized to operate the motor.

To selectively disconnect those windings for measuring their insulation resistance, relay coils 42a, 42b and 42c must be selectively energized. This is accomplished by rotating switch 116 in a clockwise direction so that it engages one of terminals 110, 112 and 114. When one of the terminals is engaged its associated relay coil is energized and as a result its associated winding is de-energized so that its insulation resistance may be measured. When testing is completed the rotary switch is released and spring 118 urges it back into its initial condition spaced apart from each of the terminals. As shown in phantom, switch 116 can engage only one terminal at any one time. As a result, at least two of relay coils 42a, 42b, and 42c always remain de-energized and their two associated motor windings are energized to drive the motor even while one of the windings is being measured.

Figure 5:
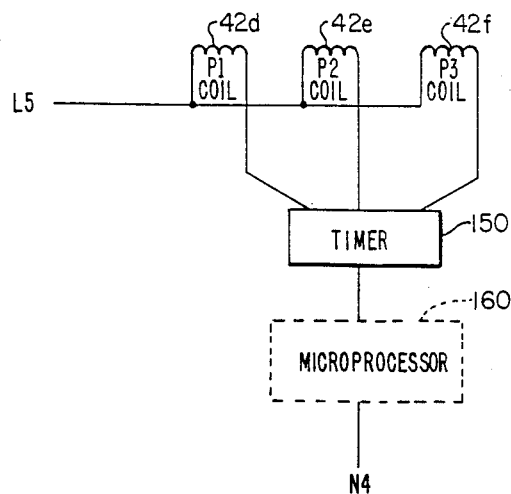
FIG. 5 is a schematic view of an alternative means such as a timer or a microprocessor for selecting the winding to be monitored.

Automatic control of the switching may be accomplished as shown in FIG. 5. Therein, each of relay coils 42d, 42e and 42f is attached at one end to a power line L5. The other end of each coil is attached to a timer 150. The timer selectively connects the opposite end of each relay coil with a neutral line N4 so that one coil at a time may be energized. Alternatively, a microprocessor 160 may be programmed to selectively actuate coils 42d, 42e and 42f and thereby disconnect one armature winding at a time for insulation resistance testing as described above.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A motor winding insulation resistance monitoring system for measuring the insulation resistance of a motor winding of a polyphase motor while the motor is operating, comprising:
    a motor winding insulation resistance measuring circuit;
    switching means for selectively interconnecting each winding with a separate phased power source and said insulation resistance measuring circuit; and
    means for directing said switching means to disconnect a winding from its power source and connect one end of that winding with said winding insulation measuring circuit to measure the resistance of that winding's insulation to ground while the motor continues operating.

2. The system of claim 1 in which said winding insulation measuring circuit includes means for applying a test voltage to said winding which is disconnected from its power source.

3. The system of claim 2 in which said means for applying includes means for applying a DC test voltage to said disconnected winding.

4. The system of claim 3 in which said means for applying includes a voltage doubler attached to an AC signal source for converting the AC signal to DC, doubling the signal and providing said doubled DC signal to said disconnected winding.

5. The system of claim 3 in which said measuring circuit is connected to an AC signal source and said means for applying includes means for filtering the AC signal from said circuit.

6. The system of claim 2 in which said means for applying includes means for doubling the test voltage applied to the disconnected winding.

7. The system of claim 6 in which said measurement circuit includes means for limiting current through said voltage doubler.

8. The system of claim 7 in which said measurement circuit includes means responsive to said applied test signal for developing a signal which is indicative of the disconnected winding's insulation resistance.

9. The system of claim 8 in which said means for developing includes means for filtering AC signals provided to such measuring circuit by the windings which remain connected.

10. The system of claim 8 in which said measuring circuit further includes means responsive to said developed signal for determining the insulation resistance.

11. The system of claim 1 in which said switching means includes a double pole double throw switch associated with each said motor winding.

12. The system of claim 1 in which said switching means includes relay means connected to a source of power and said means for directing includes means for selectively energizing said relay means to interconnect an associated winding with one of its phased power source and said insulation measuring circuit and de-energizing said relay means to interconnect said winding with the other of its phased power source and said insulation measuring circuit.

13. The system of claim 12 in which said means for selectively energizing and de-energizing includes a manually operable switch.

14. The system of claim 12 in which said means for selectively energizing and de-energizing includes timer means for energizing and de-energizing said relay means at predetermined intervals.

15. The system of claim 12 in which said means for selectively energizing and de-energizing includes microprocessor means.

16. The system of claim 1 further including means for interconnecting only one motor winding at a time with said measuring circuit.

17. The system of claim 1 further including means responsive to said measuring circuit for indicating the measured insulation resistance.

* * * * *